United States Patent
Masuo (10) Patent No.: US 7,589,991 B2
(45) Date of Patent: Sep. 15, 2009

(54) SEMICONDUCTOR MEMORY DEVICE

(75) Inventor: Akira Masuo, Osaka (JP)

(73) Assignee: Panasonic Corporation, Osaka (JP)

( * ) Notice: Subject to any disclaimer, the term of this patent is extended or adjusted under 35 U.S.C. 154(b) by 56 days.

(21) Appl. No.: 11/826,246

(22) Filed: Jul. 13, 2007

(65) Prior Publication Data

US 2008/0094879 A1   Apr. 24, 2008

(30) Foreign Application Priority Data

Oct. 19, 2006   (JP) .............................. 2006-285015

(51) Int. Cl.
  *G11C 7/00* (2006.01)
(52) U.S. Cl. ...................... 365/154; 365/205
(58) Field of Classification Search ................. 365/154, 365/205
  See application file for complete search history.

(56) References Cited

U.S. PATENT DOCUMENTS

| | | | |
|---|---|---|---|
| 6,067,256 A * | 5/2000 | Yamashita et al. ....... | 365/189.4 |
| 6,316,812 B1 | 11/2001 | Nagaoka | |
| 6,992,916 B2 * | 1/2006 | Liaw ........................... | 365/154 |
| 7,276,956 B2 * | 10/2007 | Furuta et al. ................ | 327/534 |
| 7,289,354 B2 * | 10/2007 | Houston ..................... | 365/154 |
| 2003/0081448 A1 | 5/2003 | Pathak et al. | |
| 2003/0190771 A1 * | 10/2003 | Hyun Choi ................. | 438/200 |
| 2003/0223276 A1 | 12/2003 | Yamaoka et al. | |
| 2004/0017717 A1 * | 1/2004 | Morishima .................. | 365/205 |
| 2006/0152964 A1 * | 7/2006 | Ramaraju et al. ........... | 365/154 |
| 2007/0025162 A1 | 2/2007 | Deng et al. | |

FOREIGN PATENT DOCUMENTS

JP      2002-42476      2/2002

* cited by examiner

*Primary Examiner*—Michael T Tran
(74) *Attorney, Agent, or Firm*—McDermott Will & Emery LLP (57) ABSTRACT

A storage node voltage control circuit is added to a memory cell including two load transistors, two drive transistors and two access transistors. The storage node voltage control circuit performs control so that in writing data into the memory cell, a voltage at one of the two storage nodes holding a low logic level is raised without changing voltages at respective sources of the load transistors.

19 Claims, 7 Drawing Sheets

SEMICONDUCTOR MEMORY DEVICE

BACKGROUND OF THE INVENTION

The present invention relates to a semiconductor memory device including a latch circuit for storing complementary data at two storage nodes.

There has been known a latch circuit in which an output of a first inverter is connected to an input of a second inverter and an output of the second inverter is connected to an input of the first inverter. Each of respective output nodes of the inverters forms a storage node. When each of the inverters has a CMOS structure, a CMOS latch circuit is obtained.

An SRAM memory cell having a 6-transistor structure utilizes the CMOS latch circuit and includes two load transistors, two drive transistors and two access transistors.

According to the techniques disclosed in U.S. Pat. No. 6,316,812 and Japanese Laid-Open Publication No. 2002-42476, to expand a power supply voltage range in which an SRAM memory cell can be operated, a voltage drop element is inserted between a supply line of a power supply voltage and each of respective sources of two load transistors. In writing data into a memory cell, source voltages of the load transistors are reduced, thereby making it easier to reverse a voltage at a storage node held at a high logic level ("H" level) to a low logic level ("L" level).

According to the technique disclosed in United States Patent Application Publication No. 2003/0223276, a threshold voltage of a transistor in an SRAM memory cell is detected. Then, according to the threshold voltage, a power supply voltage of the memory cell is compared to a power supply voltage of a peripheral circuit and is adjusted to an optimal voltage. Furthermore, a substrate bias is adjusted.

SUMMARY OF THE INVENTION

Each of the above-described techniques is for reducing source voltages of load transistors in writing data into a memory cell. According to the above-described techniques, a power supply voltage range in which the memory cell can be operated is expanded. However, a resistance component is inserted between a power supply voltage and the memory cell, so that the source voltages of the load transistors become lower than the power supply voltage even when the memory cell is in a data holding state. I have found that excellent retention characteristics cannot be maintained specifically in a low power supply voltage.

It is therefore an object of the present invention to expand an operating voltage margin in writing data while maintaining excellent retention characteristics of a semiconductor memory device.

To achieve the above-described object, according to the present invention, in a semiconductor memory device including a latch circuit for storing complementary data at first and second storage nodes, the configuration in which the latch circuit includes: a first load transistor having a drain connected to the first storage node, a source to which a power supply voltage is supplied and a gate connected to the second storage node; a second load transistor having a drain connected to the second storage node, a source to which the power supply voltage is supplied and a gate connected to the first storage node; a first drive transistor having a drain connected to the first storage node and a gate connected to the second storage node; a second drive transistor having a drain connected to the second storage node and a gate connected to the first storage node; and a storage node voltage control circuit for performing control so that a voltage at one of the first and second storage nodes holding a "L" level is raised without changing a voltage at each of the sources of the first and second load transistors.

In one embodiment of the present invention, the storage node voltage control circuit connects, in writing data into the latch circuit, the first storage node and the second storage node to equalize each of a voltage at the first storage node and a voltage at the second storage node to an intermediate voltage.

In another embodiment of the present invention, the storage node voltage control circuit raises, in writing data into the latch circuit, a voltage of one of the first and second storage nodes holding a low logic level to a "H" level.

When the first storage node holds the "H" level and the second storage node holds the "L" level, the storage node voltage control circuit performs control so that in writing data into the latch circuit, the voltage at the second storage node is raised. Thus, a gate-source voltage in the first load transistor is reduced and an equivalent resistance thereof is increased, so that the voltage of the first node is readily reversed to the "L" level. In contrast, when the first storage node holds the "L" level and the second storage node holds the "H" level, the storage node voltage control circuit performs control so that in writing data into the latch circuit, the voltage at the first storage node is raised. Thus, a gate-source voltage in the second load transistor is reduced and an equivalent resistance thereof is increased, so that the voltage at the second storage node is readily reversed to the "L" level. Accordingly, in either one of the above-described cases, reverse of storage data in the latch circuit is readily performed, so that an operation voltage margin in writing data is expanded. Furthermore, the power supply voltage applied to each of the sources of the first and second load transistors is not changed. Therefore, excellent retention characteristics can be maintained.

DESCRIPTION OF THE PREFERRED EMBODIMENTS

Hereafter, embodiments of the present invention will be described in detail with reference to the accompanying drawings.

Figure 1:
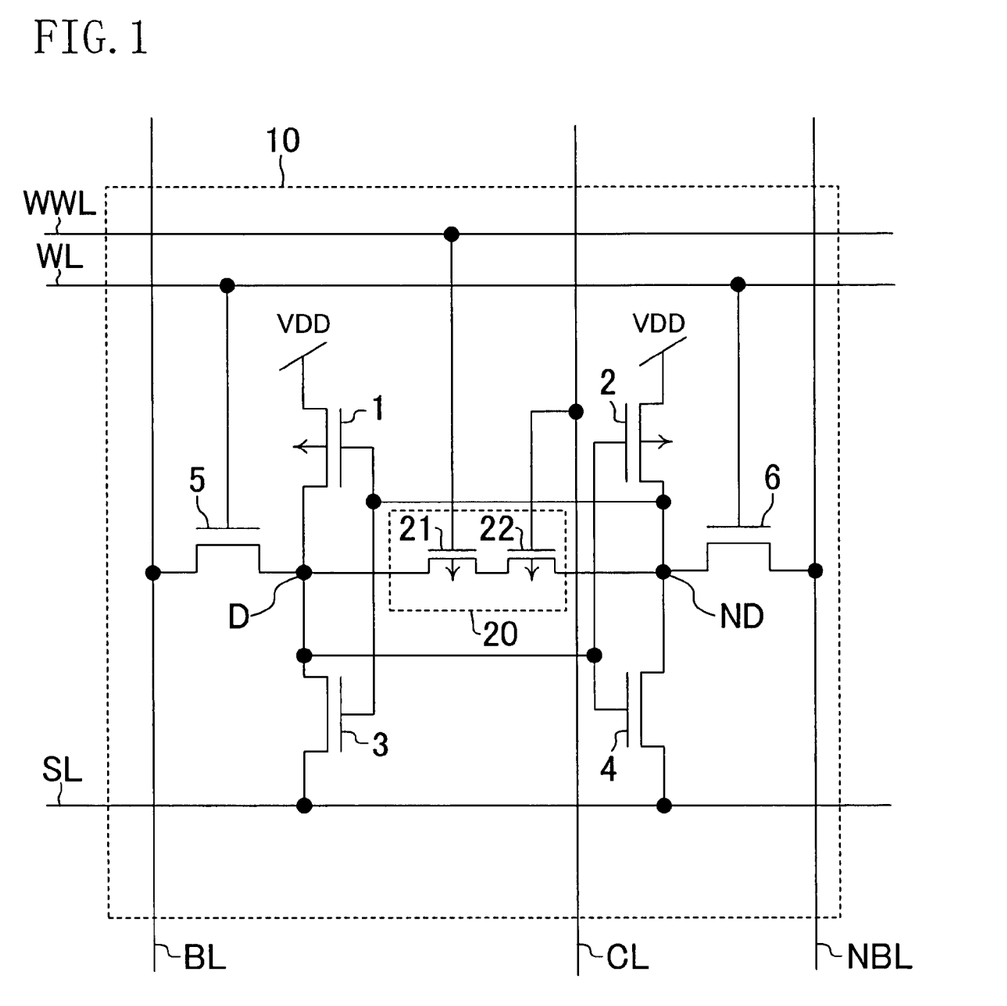
FIG. 1 is a circuit diagram illustrating an exemplary configuration of a memory cell in an SRAM which is a semiconductor memory device according to the present invention.

FIG. 1 is a circuit diagram illustrating an exemplary configuration of a memory cell in an SRAM which is a semiconductor memory device according to the present invention. A memory cell 10 of FIG. 1 is a memory cell for storing complementary data in first and second storage nodes D and DN and includes first and second load transistors 1 and 2, first and second drive transistors 3 and 4, first and second access transistors 5 and 6 and a storage node voltage control circuit 20.

More specifically, the first load transistor 1 is a p-channel MOS transistor having a drain connected to a first storage node D, a source to which a power supply voltage VDD is supplied and a gate connected to the second storage node ND. The second load transistor 2 is a p-channel MOS transistor having a drain connected to the second storage node ND, a source to which the power supply voltage VDD is supplied and a gate connected to the first storage node D. The first drive transistor 3 is an n-channel MOS transistor having a drain connected to the first storage node D, a source connected to a source line SL and a gate connected to the second storage node ND. The second drive transistor 4 is an n-channel MOS transistor having a drain connected to the second storage node ND, a source connected to the source line SL and a gate connected to the first storage node D. The first access transistor 5 which is an n-channel MOS transistor is provided between the first storage node D and a first bit line BL and the second access transistor 6 which is an n-channel MOS transistor is provided between the second storage node ND and a second bit line NBL. Respective gates of the first and second access transistors 5 and 6 are connected to a word line WL.

The storage node voltage control circuit 20 includes first and second equalizing transistors 21 and 22 connected in series between the first storage node D and the second storage node ND. A gate of the first equalizing transistor 21 is controlled by an auxiliary word line WWL and a gate of the second equalizing transistor 22 is controlled by a column line CL so that in writing data into the memory cell 10, each of a voltage at the first storage node D and a voltage at the second storage node ND is equalized to an intermediate voltage. In this case, an example where each of the first and second equalizing transistors 21 and 22 is a p-channel MOS transistor is described. After the equalization, the intermediate voltage at the first storage node D may be slightly different from the intermediate voltage at the second storage node ND.

Figure 2:
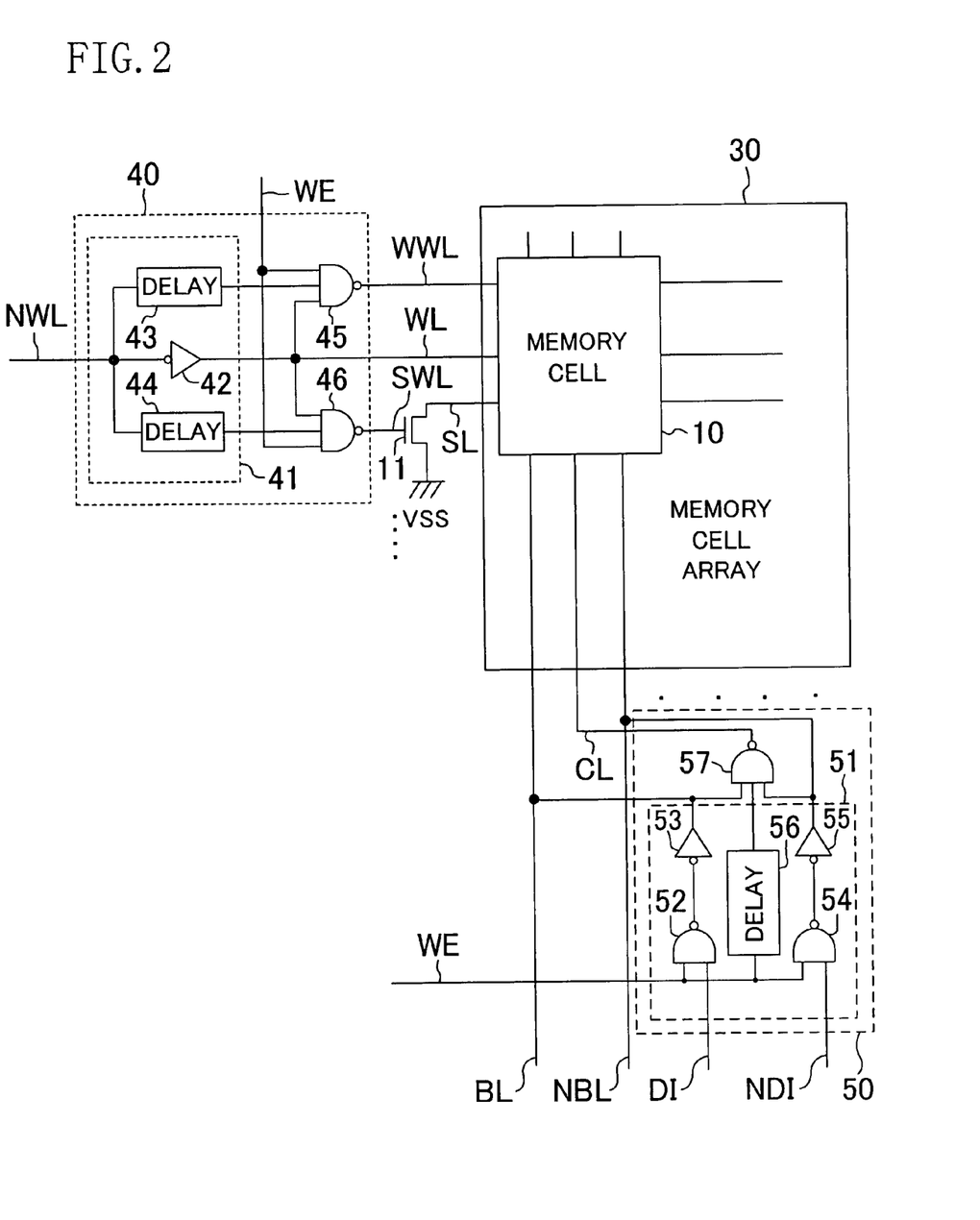
FIG. 2 is a circuit diagram illustrating an exemplary schematic configuration of an SRAM including the memory cell of FIG. 1 when the SRAM is in a write operation.

FIG. 2 is a circuit diagram illustrating an exemplary schematic configuration of an SRAM including the memory cell 10 of FIG. 1 when the SRAM is in a write operation. The configuration in connection with data reading of a sense amplifier or the like will be omitted. In FIG. 2, 11 denotes a current cutoff transistor, 30 denotes a memory cell array and 40 and 50 denote first and second pulse generation circuits, respectively. In this case, an example where the current cutoff transistor 11 provided outside of the memory cell array 30 is an n-channel MOS transistor will be described.

The memory cell array 30 includes a plurality of memory cells 10 each of which has the configuration of FIG. 1 and which are arrayed in a matrix. Ones of the memory cells 10 which belong to the same row share the word line WL, the auxiliary word line WWL, and the source line SL and ones of the memory cells 10 which belong to the same column share the first bit line BL, the second bit line NBL and the column line CL. In FIG. 2, only a single memory cell 10 is shown for the purpose of simplification.

The first pulse generation circuit 40 includes a word line drive circuit 41 and first and second 3-input NAND circuits 45 and 46. The word line drive circuit 41 includes an inverter 42 and first and second delay circuits 43 and 44. The inverter 42 is provided for driving the word line WL by a signal obtained by reversing a word line selection signal NWL which is a pulse signal for selecting a single row of the memory cells 10. The first delay circuit 43 supplies a signal obtained by delaying the word line selection signal NWL for a predetermined time to one input of the first 3-input NAND circuit 45. The second delay circuit 44 supplies a signal obtained by delaying the word line selection signal NWL for a predetermined time to one input of the second 3-input NAND circuit 46. The first 3-input NAND circuit 45 receives a write enable signal WE and a signal on the word line WL at the other two inputs to drive the auxiliary word line WWL. The second 3-input NAND circuit 46 receives the write enable signal WE and the signal on the word line WL at the other two inputs to drive another auxiliary word line SWL. A pulse width of a signal on the auxiliary word line (which will be hereafter referred to as the "first auxiliary word line") WWL can be adjusted according to a delay time in the first delay circuit 43 and a pulse width of a signal on the other auxiliary word line (which will be hereafter referred to as the "second auxiliary word line") SWL can be adjusted according to a delay time in the second delay circuit 44.

The current cutoff transistor 11 is an n-channel MOS transistor having a drain connected to the source line SL, a source to which a ground voltage VSS is supplied and a gate connected to the second auxiliary word line SWL.

The second pulse generation circuit 50 includes a write circuit 51 and a 3-input NAND circuit 57. The write circuit 51 includes first and second 2-input NAND circuits 52 and 54, first and second inverters 53 and 55 and a delay circuit 56. DI and NDI denote first and second write data lines for receiving a complementary data signal, respectively. The first 2-input NAND circuit 52 receives the write enable signal WE and a signal on the first write data line DI to drive an input of the first inverter 53. The first inverter 53 drives the first bit line BL. The second 2-input NAND circuit 54 receives the write enable signal WE and a signal on the second write data line NDI to drive the second inverter 55. The second inverter 55 drives the second bit line NBL. The delay circuit 56 supplies a signal obtained by delaying the write enable signal WE for a predetermined time to one input of the 3-input NAND circuit 57. The 3-input NAND circuit 57 receives a signal on the first bit line BL and a signal on the second bit line NBL at the other two inputs, respectively, to drive the column line CL. A pulse width of a signal on the column line CL can be adjusted according to a delay time in the delay circuit 56.

Figure 3:
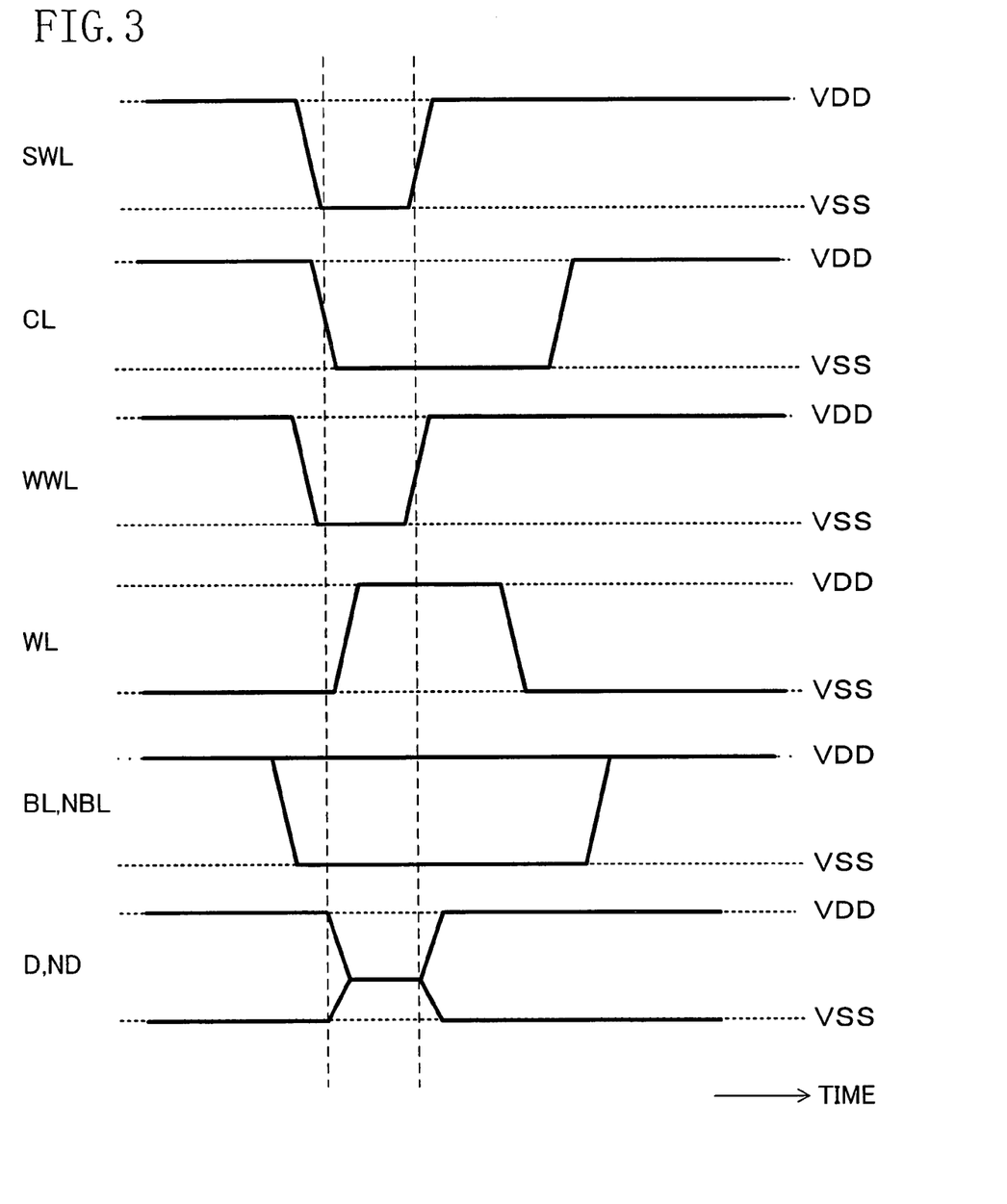
FIG. 3 is a timing chart describing the operation of the memory cell of FIG. 1 and FIG. 2.

FIG. 3 is a timing chart describing the operation of the memory cell 10 of FIG. 1 and FIG. 2. In this case, the first storage node D holds the "L" level and the second storage node ND holds the "H" level. In this state, each of the first load transistor 1 and the second drive transistor 4 is in an OFF state and each of the second load transistor 2 and the first drive transistor 3 is in an ON state. Each of the first and second access transistors 5 and 6 holds an OFF state, each of the first and second equalizing transistors 21 and 22 also holds an OFF state and the current cutoff transistor 11 holds an ON state. A "H" level signal and an "L" level signal are supplied to the first write data line DI and the second write data line NDI, respectively, so as to reverse complementary data stored in the memory cell 10. As a result, the first bit line BL is driven to the "H" level and the second bit line NBL is driven to the "L" level.

According to FIG. 3, before the word line WL rises to the "H" level, the first auxiliary word line WWL, the second auxiliary word line SWL and the column line CL fall to the "L" level. As a result, each of the first and second equalizing transistors 21 and 22 transits from an OFF state to an ON state and the current cutoff transistor 11 transits from an ON state to an OFF state. With each of the first and second equalizing transistors 21 and 22 turned ON, the first storage node D and the second storage node ND are connected to each other and respective voltages at the storage nodes D and ND are equalized to be an intermediate voltage (a certain voltage between VDD and VSS). As a result, a source voltage of the second load transistor 2 is not changed and stays to be VDD and a voltage of the first storage node D is raised from an "L level voltage to the intermediate voltage. Thus, a gate-source voltage of the second load transistor 2 is reduced and an equivalent resistance thereof is increased. In this case, a current will flow to the source line SL from the power supply voltage VDD through the second load transistor 2, the storage node voltage control circuit 20 and the first drive transistor 3 but the current is cut off by the current cutoff transistor 11 which is in an OFF state.

Next, when the word line WL rises to the "H" level, each of the first and second access transistors 5 and 6 transits from an OFF state to an ON state. In this case, a series circuit of the second load transistor 2 and the second access transistor 6 is connected to between the power supply voltage VDD and the second bit line NBL which has been dragged down to the ground voltage VSS. A voltage at the second storage node ND is determined by resistive division by the second load transistor 2 and the second access transistor 6. Then, an ON resistance of the second load transistor 2 which has been increased beforehand as described exceeds an ON resistance of the second access transistor 6, so that a voltage at the second storage node ND is readily dropped to a logic threshold voltage of an inverter including the first load transistor 1 and the first drive transistor 3. As a result, the first storage node D and the second storage node ND are readily reversed to the "H" level and the "L" level, respectively.

Even when the first storage node D holds the "H" level and the second storage node ND holds the "L" level, reverse of storage data is readily achieved in the same manner.

As has been described, according to the configuration of FIG. 1, each of the respective source voltages of the first and second load transistors 1 and 2 of the memory cell 10 is equal to the power supply voltage VDD. Thus, compared to the known techniques, a variable range of the power supply voltage in a retention state when holding data can be expanded. Specifically, an operating voltage range in writing data and a variable voltage range in a retention state can be expanded at the same time. Therefore, the effect of reducing voltage and power consumption of a memory can be achieved.

Control may be performed so that after the word line WL rises to the "H" level, the first auxiliary word line WWL and the column line CL falls to the "L" level and then at least one of the first auxiliary word line WWL and the column line CL rises to the "H" level before the word line WL falls to the "L" level. In this case, the storage node voltage control circuit 20 is driven by a pulse having a shorter activation period than a period in which the word line WL is activated and, as a result, power consumption of the storage node voltage control circuit 20 is further reduced.

Moreover, either one of the first and second equalizing transistors 21 and 22 can be omitted. The source line SL may be provided in parallel to the first and second bit lines BL and NBL. Moreover, the current cutoff transistor 11 may be provided in each of the memory cells 10. When the current does not cause any problem, the current cutoff transistor 11 may be omitted.

Figure 4:
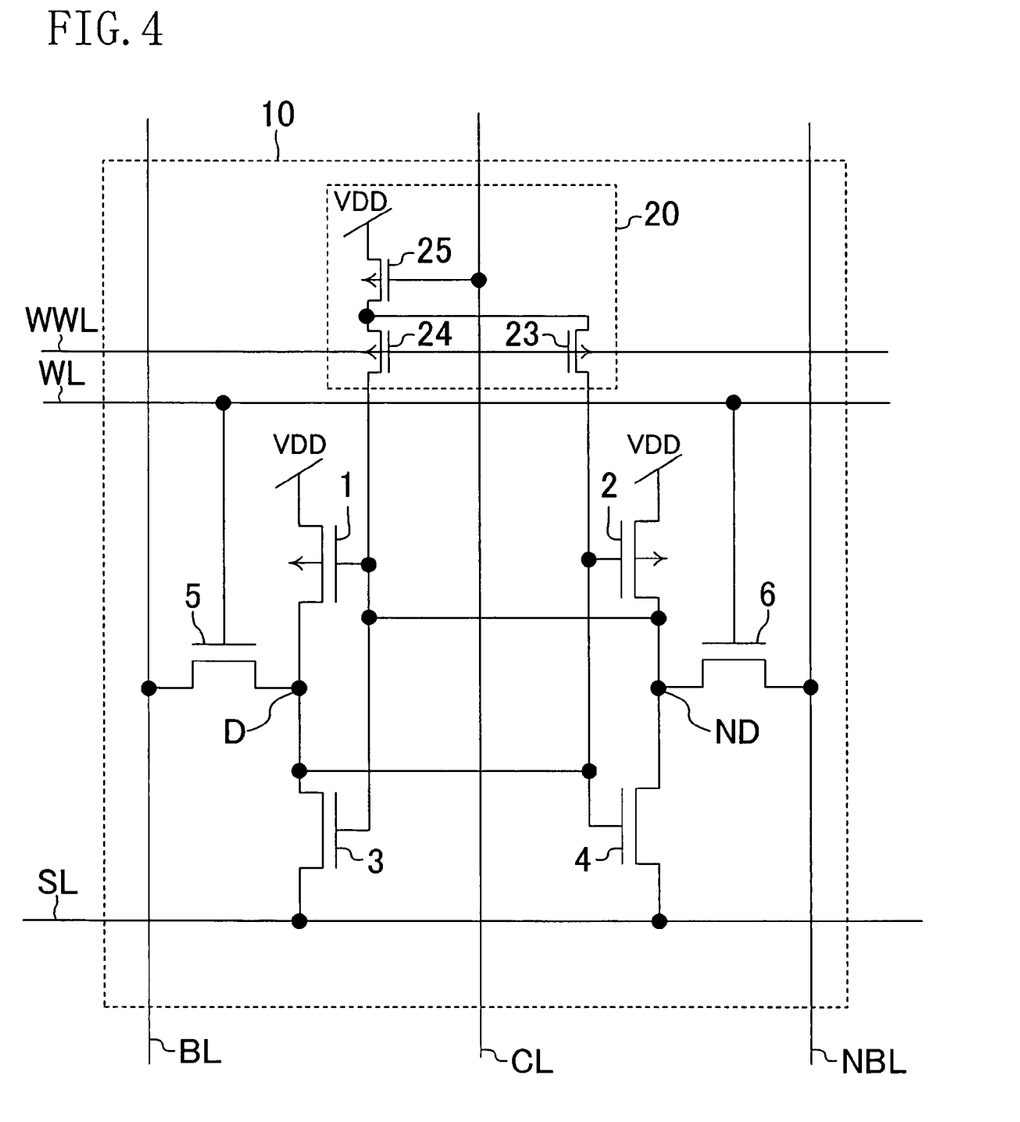
FIG. 4 is a circuit diagram illustrating a modified example of the configuration of FIG. 1.

FIG. 4 is a circuit diagram illustrating a modified example of the configuration of FIG. 1. A storage node voltage control circuit 20 of FIG. 4 includes a first charge transistor 23 having a drain connected to the first storage node D, a second charge transistor 24 having a drain connected to the second storage node ND and a third charge transistor 25 provided between each of respective sources of the first and second charge transistors 23 and 24 and the power supply voltage VDD. In the storage node voltage control circuit 20, each of respective gates of the first and second charge transistors 23 and 24 is controlled by the first auxiliary word line WWL and a gate of the third charge transistor 25 is controlled by the column line CL so that each of a voltage at the first storage node D and a voltage at the second storage node ND is raised to the "H" level in writing data to the memory cell 10. In this case, an example where each of the first, second and third charge transistors 23, 24 and 25 is a p-channel type MOS transistor is described.

Figure 5:
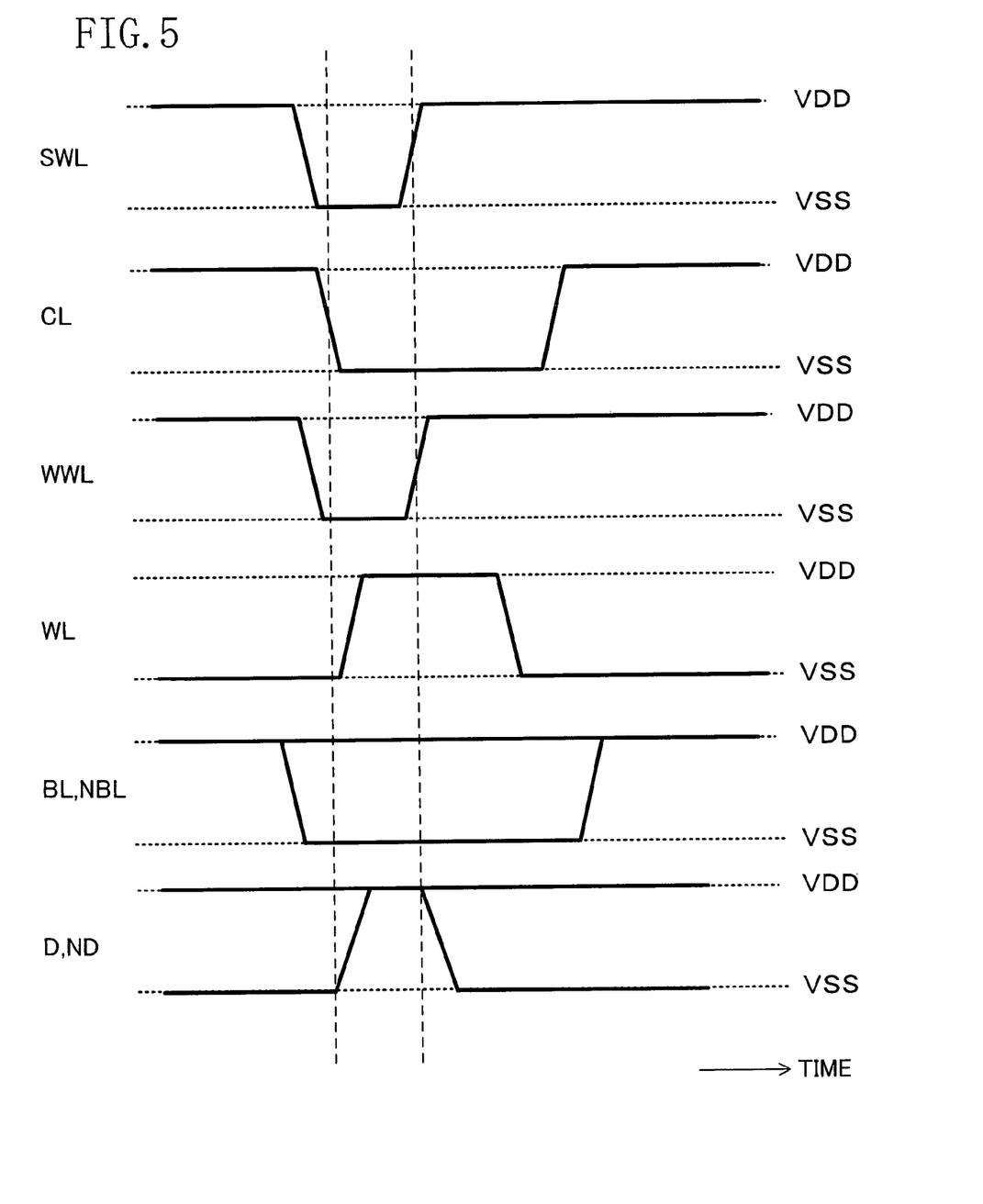
FIG. 5 is a timing chart describing the operation of a memory cell of FIG. 4.

FIG. 5 is a timing chart describing the operation of a memory cell 10 of FIG. 4. According to FIG. 5, in writing data into the memory cell 10, each of the voltage at the first storage node D and the voltage of the second storage node ND is raised to the "H" level by the storage node voltage control circuit 20 once and, as a result, one of first and second load transistors 1 and 2 which has held an ON state is turned OFF. Accordingly, reverse of storage data can be readily achieved.

The third charge transistor 25 may be disposed outside of the memory cell array 30 so that ones of the memory cells 10 which belong to the same column share the third charge transistor 25. In that case, respective sources of the first and second charge transistors 23 and 24 in one of the memory cells 10 are connected to respective sources of first and second charge transistors 23 and 24 in another one of the memory cells 10 having the same configuration, respectively.

Figure 6:
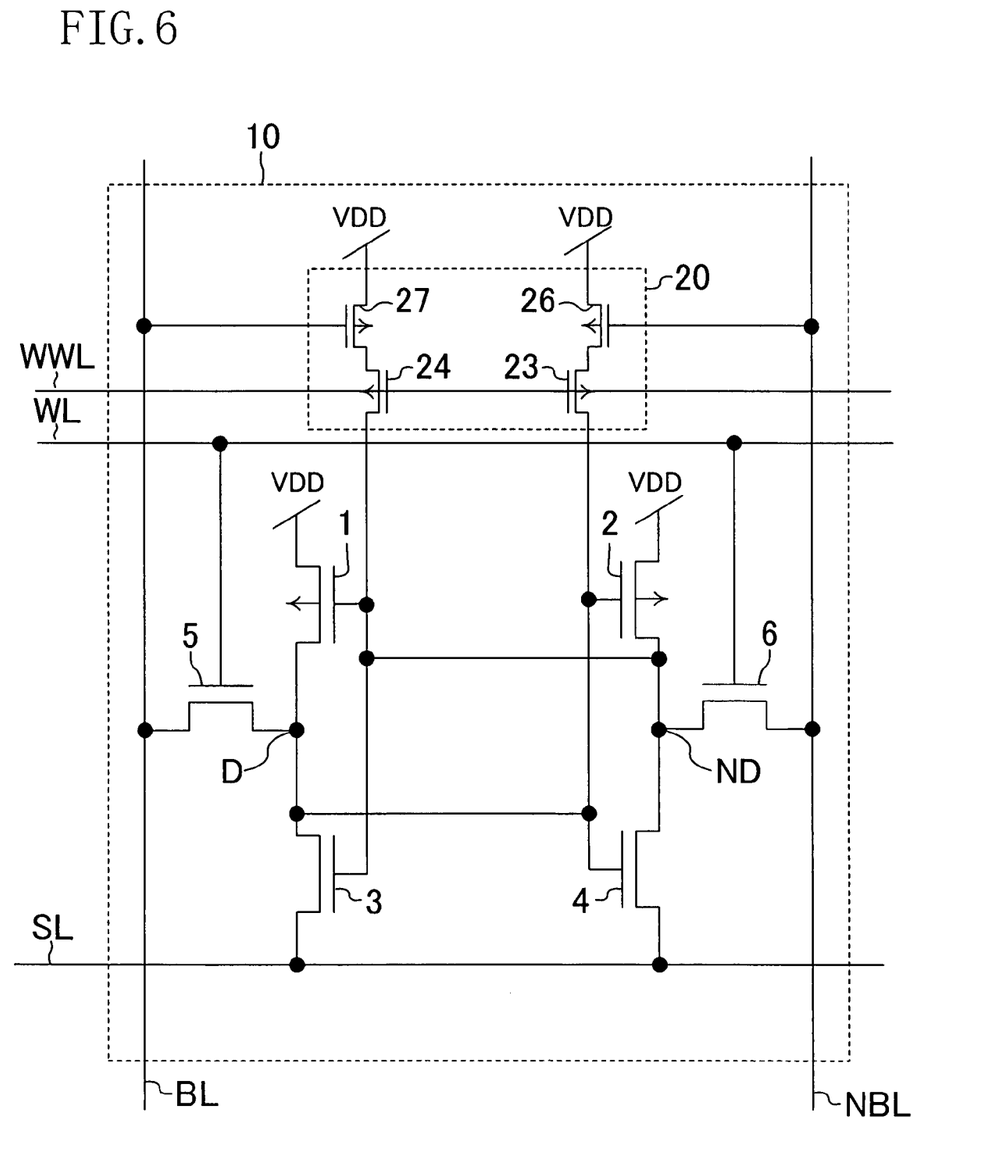
FIG. 6 is a circuit diagram illustrating a modified embodiment of the configuration of FIG. 4.

FIG. 6 is a circuit diagram illustrating a modified embodiment of the configuration of FIG. 4. A storage node voltage control circuit 20 of FIG. 6 includes a first charge transistor 23 having a drain connected to the first storage node D, a second charge transistor 24 having a drain connected to the second storage node ND, a third charge transistor 26 provided between a source of the first charge transistor 23 and a power supply voltage VDD and a fourth charge transistor 27 provided between a source of the second charge transistor 24 and the power supply voltage VDD. In the storage node voltage control circuit 20, each of respective gates of the first and second charge transistors 23 and 24 is controlled by the first auxiliary word line WWL, a gate of the third charge transistor 26 is controlled by the second bit line NBL and a gate of the fourth charge transistor 27 is controlled by the first bit line BL so that in writing data into the memory cell 10, an "L" level voltage at one of the first and second storage nodes D and ND which is to be reversed to the "H" level via the first bit line BL or the second bit line NBL is raised to the H" level. In this case, an example where each of the first through fourth charge transistors 23, 24, 26 and 27 is a p-channel MOS transistor is described.

According to the configuration of FIG. 6, in writing data into the memory cell 10, when data held in the first and second storage nodes D and ND is not reversed, the storage node voltage control circuit 20 does not change respective voltages of the first and second storage nodes D and ND. When data held in the first and second storage nodes D and ND is reversed, an "L" level voltage at one of the first and second storage nodes D and ND which is to be reversed to the "H" level via the first bit line BL or the second bit line NBL is raised to the "H" level by the storage node voltage control circuit 20. Accordingly, reverse of storage data can be readily achieved.

Either one of a group of the first and second charge transistors 23 and 24 and a group of the third and fourth charge transistors 26 and 27 can be omitted. If each of the gates of the third and fourth charge transistors 26 and 27 is made to be controlled by a column line, an equivalent configuration as that of FIG. 4 can be obtained.

Figure 7:
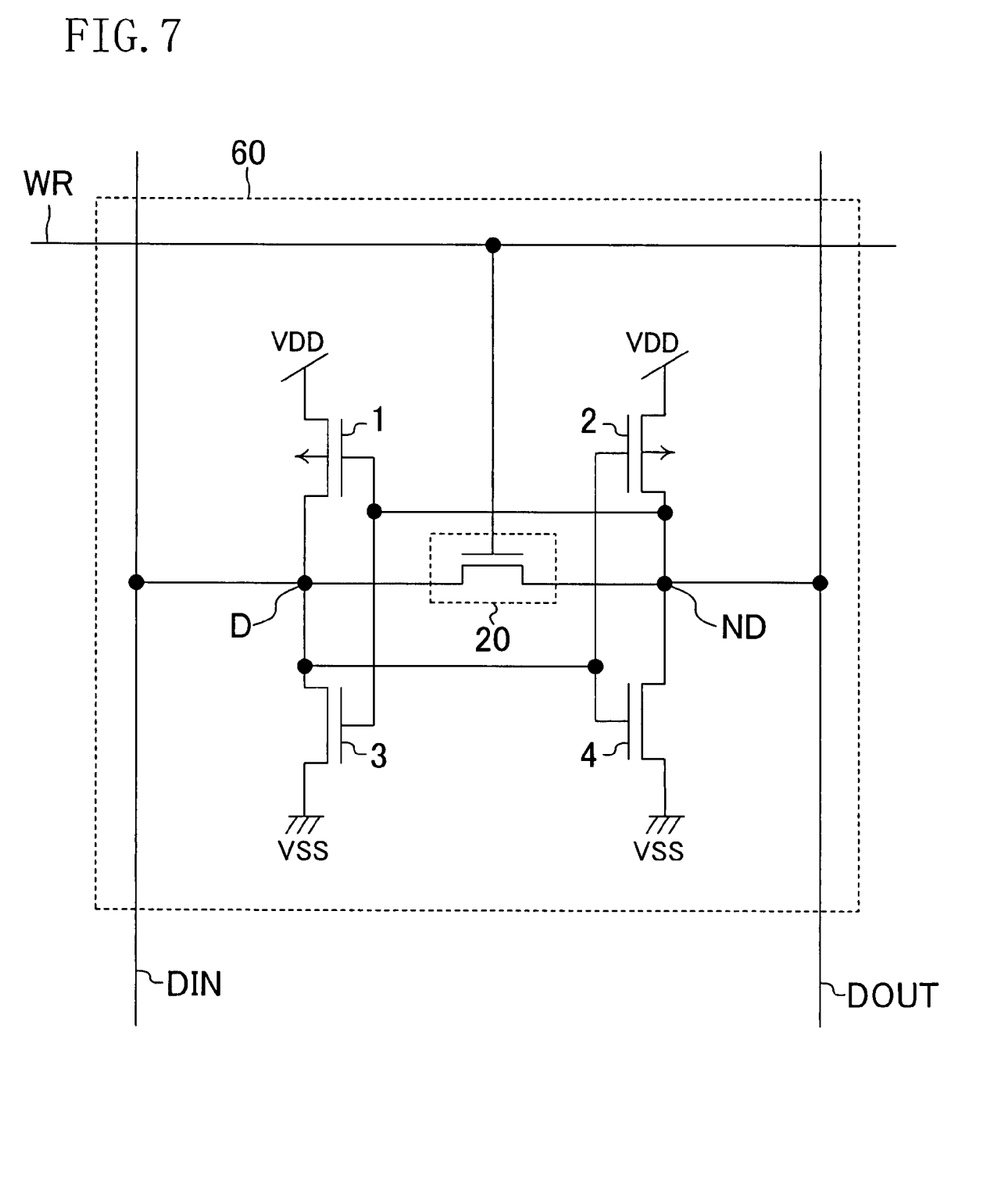
FIG. 7 is a circuit diagram illustrating an exemplary configuration of a latch circuit which is a semiconductor memory device according to the present invention.

FIG. 7 is a circuit diagram illustrating an exemplary configuration of a latch circuit which is a semiconductor memory device according to the present invention. The latch circuit 60 of FIG. 7 is a circuit for storing complementary data at first and second storage nodes D and ND and includes first and second load transistors 1 and 2, first and second drive transistors 3 and 4 and a storage node voltage control circuit 20. The first storage node D is connected to an input data line DIN and the second storage node ND is connected to an output data line DOUT.

More specifically, the first load transistor 1 is a p-channel MOS transistor having a drain connected to the first storage node D, a source to which a power supply voltage VDD is supplied and a gate connected to the second storage node ND. The second load transistor 2 is a p-channel MOS transistor having a drain connected to the second storage node ND, a source to which the power supply voltage VDD is supplied and a gate connected to the first storage node D. The first drive transistor 3 is an n-channel MOS transistor having a drain connected to the first storage node D, a source to which a ground voltage VSS is supplied and a gate connected to the second storage node ND. The second drive transistor 4 is an n-channel MOS transistor having a drain connected to the second storage node ND, a source to which the ground voltage VSS is supplied and a gate connected to the first storage node D. The storage node voltage control circuit 20 includes an equalizing transistor provided between the first storage node D and the second storage node ND. A gate of the equalizing transistor is controlled by a write pulse line WR so that in writing data into the latch circuit 60, each of a voltage at the first storage node D and a voltage of the second storage node ND is equalized to be an intermediate voltage. In this case, an example where the equalizing transistor is an n-channel MOS transistor is described.

According to the configuration of FIG. 7, in writing data into the latch circuit 60, if a "H" level pulse is supplied to the write pulse line WR, an "L" level voltage at one of the first and second storage nodes D and ND is raised to an intermediate voltage. Accordingly, reverse of storage data can be readily achieved.

The present invention is not limited to the above-described embodiments and various modifications are possible without departing from the spirit and material features of the present invention. For example, the present invention is applicable not only to the 1-port memory cells of FIG. 1, FIG. 4 and FIG. 6 but also to a multiport memory cell.

As has been described, in a semiconductor memory device according to the present invention, an operation voltage margin in writing data can be expanded while maintaining excellent retention characteristics. Therefore, the semiconductor device of the present invention is useful as an SRAM memory cell including a latch circuit, specifically, such as a cache memory or the like for microprocessing.

What is claimed is:

1. A semiconductor memory device which includes a latch circuit for storing complementary data at first and second storage nodes,
    wherein the latch circuit comprises:
    a first load transistor having a drain connected to the first storage node, a source to which a power supply voltage is supplied and a gate connected to the second storage node;
    a second load transistor having a drain connected to the second storage node, a source to which the power supply voltage is supplied and a gate connected to the first storage node;
    a first drive transistor having a drain connected to the first storage node and a gate connected to the second storage node;
    a second drive transistor having a drain connected to the second storage node and a gate connected to the first storage node; and
    a storage node voltage control circuit which has a function of connecting one of the first and the second storage nodes, which holds a low logic level, and a third node, which holds a high logic level.

2. The semiconductor memory device of claim 1, wherein the storage node voltage control circuit performs the function when writing data into the latch circuit.

3. The semiconductor memory device of claim 1, wherein the third node is the other one of the first or the second storage node, which holds the high logic level.

4. The semiconductor memory device of claim 1, wherein the third node is a node to which the power supply voltage is supplied.

5. The semiconductor memory device of claim 4, further comprising a current cut-off transistor provided between each of respective sources of the first and second drive transistors and a ground voltage.

6. The semiconductor memory device of claim 1, further comprising a current cut-off transistor provided between each of respective sources of the first and second drive transistors and a ground voltage.

7. The semiconductor memory device of claim 6, wherein the current cut-off transistor is controlled to be in an OFF state when the storage node voltage control circuit is in an ON state.

8. The semiconductor memory device of claim 1, further comprising:
    a word line;
    first and second bit lines;
    a first access transistor provided between the first bit line and the first storage node and having a gate connected to the word line; and
    a second access transistor provided between the second bit line and the second storage node and having a gate connected to the word line.

9. A semiconductor memory device which includes a latch circuit for storing complementary data at first and second storage nodes,
    wherein the latch circuit comprises:
    a first load transistor having a drain connected to the first storage node, a source to which a power supply voltage is supplied and a gate connected to the second storage node;
    a second load transistor having a drain connected to the second storage node, a source to which the power supply voltage is supplied and a gate connected to the first storage node;
    a first drive transistor having a drain connected to the first storage node and a gate connected to the second storage node;
    a second drive transistor having a drain connected to the second storage node and a gate connected to the first storage node; and
    a storage node voltage control circuit which has a function of connecting the first storage node and the second storage node.

10. The semiconductor memory device of claim 9, wherein the storage node voltage control circuit equalizes each of a voltage at the first storage node and the second storage node to an intermediate voltage.

11. The semiconductor memory device of claim 9, further comprising a current cut-off transistor provided between each of respective sources of the first and second drive transistors and a ground voltage.

12. A semiconductor memory device which includes a latch circuit for storing complementary data at first and second storage nodes,
wherein the latch circuit comprises:
a first load transistor having a drain connected to the first storage node, a source to which a power supply voltage is supplied and a gate connected to the second storage node;
a second load transistor having a drain connected to the second storage node, a source to which the power supply voltage is supplied and a gate connected to the first storage node;
a first drive transistor having a drain connected to the first storage node and a gate connected to the second storage node;
a second drive transistor having a drain connected to the second storage node and a gate connected to the first storage node;
a storage node voltage control circuit for performing control so that a voltage at one of the first and second storage nodes holding a low logic level is raised without changing a voltage at each of the sources of the first and second load transistors; and
a current cut-off transistor provided between each of respective sources of the first and second drive transistors and a ground voltage.

13. The semiconductor memory device of claim 12, wherein the current cut-off transistor is controlled to be in an OFF state when the storage node voltage control circuit is in an ON state.

14. A semiconductor memory device which includes a latch circuit for storing complementary data at first and second storage nodes, wherein the latch circuit comprises:
a first load transistor having a drain connected to the first storage node, a source to which a power supply voltage is supplied and a gate connected to the second storage node;
a second load transistor having a drain connected to the second storage node, a source to which the power supply voltage is supplied and a gate connected to the first storage node;
a first drive transistor having a drain connected to the first storage node and a gate connected to the second storage node;
a second drive transistor having a drain connected to the second storage node and a gate connected to the first storage node;
a word line;
first and second bit lines;
a first access transistor provided between the first bit line and the first storage node and having a gate connected to the word line;
a second access transistor provided between the second bit line and the second storage node and having a gate connected to the word line; and
a storage node voltage control circuit including first and second equalizing transistors connected in series between the first storage node and the second storage node.

15. The semiconductor memory device of claim 14, wherein a gate of the first equalizing transistor is controlled by an auxiliary word line and a gate of the second equalizing transistor is controlled by a column line so that in writing data into the latch circuit, each of a voltage at the first storage node and a voltage at the second storage node is equalized to an intermediate voltage.

16. A semiconductor memory device which includes a latch circuit for storing complementary data at first and second storage nodes, wherein the latch circuit comprises:
a first load transistor having a drain connected to the first storage node, a source to which a power supply voltage is supplied and a gate connected to the second storage node;
a second load transistor having a drain connected to the second storage node, a source to which the power supply voltage is supplied and a gate connected to the first storage node;
a first drive transistor having a drain connected to the first storage node and a gate connected to the second storage node;
a second drive transistor having a drain connected to the second storage node and a gate connected to the first storage node;
a word line;
first and second bit lines;
a first access transistor provided between the first bit line and the first storage node and having a gate connected to the word line;
a second access transistor provided between the second bit line and the second storage node and having a gate connected to the word line; and
a storage node voltage control circuit,
wherein the storage node voltage control circuit comprises:
a first charge transistor having a drain connected to the first storage node;
a second charge transistor having a drain connected to the second storage node; and
a third charge transistor provided between each of respective sources of the first and second charge transistors and the power supply voltage.

17. The semiconductor memory device of claim 16, wherein each of respective gates of the first and second charge transistors is controlled by an auxiliary word line and a gate of the third charge transistor is controlled by a column line so that in writing data into the latch circuit, each of a voltage at the first storage node and a voltage at the second storage node is raised to a high logic level.

18. A semiconductor memory device which includes a latch circuit for storing complementary data at first and second storage nodes, wherein the latch circuit comprises:
a first load transistor having a drain connected to the first storage node, a source to which a power supply voltage is supplied and a gate connected to the second storage node;
a second load transistor having a drain connected to the second storage node, a source to which the power supply voltage is supplied and a gate connected to the first storage node;
a first drive transistor having a drain connected to the first storage node and a gate connected to the second storage node;
a second drive transistor having a drain connected to the second storage node and a gate connected to the first storage node;
a word line;
first and second bit lines;
a first access transistor provided between the first bit line and the first storage node and having a gate connected to the word line;
a second access transistor provided between the second bit line and the second storage node and having a gate connected to the word line; and
a storage node voltage control circuit, wherein the storage node voltage control circuit comprises:

a first charge transistor having a drain connected to the first storage node;

a second charge transistor having a drain connected to the second storage node;

a third charge transistor provided between a source of the first charge transistor and the power supply voltage; and a fourth charge transistor provided between a source of the second charge transistor and the power supply voltage.

19. The semiconductor memory device of claim 18, wherein each of respective gates of the first and second charge transistors is controlled by an auxiliary word line, a gate of the third charge transistor is controlled by the second bit line and a gate of the fourth charge transistor is controlled by the first bit line so that in writing data into the latch circuit, a low logic level voltage at one of the first and second storage nodes which is to be reversed via the first or second bit lines is raised to a high logic level.

* * * * *